(12) United States Patent
Massoudi

(10) Patent No.: US 6,260,169 B1
(45) Date of Patent: Jul. 10, 2001

(54) DEVICE AND METHOD FOR REAL TIME CORRECTION OF ROW DATA FROM DVD MEDIA

(75) Inventor: Firooz Massoudi, Santa Clara, CA (US)

(73) Assignee: STMicroelectronics N.V. (NL)

( * ) Notice: Subject to any disclaimer, the term of this patent is extended or adjusted under 35 U.S.C. 154(b) by 0 days.

(21) Appl. No.: 09/052,917

(22) Filed: Mar. 31, 1998

(51) Int. Cl.[7] ................................................. G11C 29/00
(52) U.S. Cl. ................................. 714/769; 714/785
(58) Field of Search .................................. 714/769, 770, 714/772, 774, 775, 753, 758, 785; 345/14

(56) References Cited

U.S. PATENT DOCUMENTS

| | | | |
|---|---|---|---|
| 4,637,021 | 1/1987 | Shenton | 714/756 |
| 4,683,469 | * 7/1987 | Elsmore et al. | 345/14 |
| 4,750,178 | 6/1988 | Sako et al. | 714/755 |
| 5,313,464 | * 5/1994 | Cromer et al. | 371/40.1 |
| 5,453,996 | 9/1995 | Nakamura | 714/756 |
| 5,551,009 | * 8/1996 | Amini et al. | 395/492 |
| 5,719,884 | 2/1998 | Roth et al. | 714/755 |
| 5,805,564 | 9/1998 | Kobayashi et al. | 369/275.3 |
| 5,805,617 | 9/1998 | Im | 714/785 |
| 5,829,007 | * 10/1998 | Wise et al. | 711/5 |
| 5,905,864 | * 5/1999 | Terasima et al. | 711/168 |
| 5,917,836 | 6/1999 | Ichikawa et al. | 714/755 |
| 5,920,578 | * 7/1999 | Zook | 714/753 |
| 5,970,208 | * 10/1999 | Shimn | 386/126 |
| 5,978,958 | 11/1999 | Tanaka et al. | 714/804 |
| 5,991,911 | * 11/1999 | Zook | 714/758 |

OTHER PUBLICATIONS

Chang, H.C., Shung, C., "A Reed–Solomon Product–Code (RS–PC) decoder for DVD applications," 1998 Solid State Conference, Digest of Technical Papers. Feb. 5–7, 1998.*
Jim Taylor, "DVD demystified: the guidebook for DVD–video and DVD–ROM" Ch. 3 and 4, © 1998, McGraw–Hill, Inc., New York, NY.

* cited by examiner

Primary Examiner—Albert Decady
Assistant Examiner—David Ton
(74) Attorney, Agent, or Firm—Theodore E. Galanthay; Lisa K. Jorgenson; Steven H. Slater

(57) ABSTRACT

Disclosed is a device for performing a header and row correction on rows of sector data that are read sequentially from a DVD medium. The device includes a pair of row buffers, a syndrome generator, and an error correction circuitry. The pair of row buffers sequentially receives and stores a current row of the sector data. When one buffer is receiving a next row of the sector data and is functioning as a receive buffer, the other buffer stores the current row of the sector data and functions as a correction buffer to be used in error correction. The syndrome generator receives the current row of the sector data and is configured to sequentially generate a row syndrome for the current row. The row syndrome is configured to indicates whether an error is present in the current row that is stored in the correction buffer. The error correction circuitry is coupled to the syndrome generator and is configured to receive the row syndrome associated with the current row that is stored in the correction buffer. The error correction circuitry is configured to correct the error that is present in the current row that is contained in the correction buffer.

26 Claims, 9 Drawing Sheets

DEVICE AND METHOD FOR REAL TIME CORRECTION OF ROW DATA FROM DVD MEDIA

CROSS REFERENCE TO RELATED APPLICATIONS

The present application is related to co-pending U.S. patent application Ser. No. 09/052,912 filed on an even day herewith, entitled "Device and Method for Decoding Data Streams from DVD Media," by inventor Firooz Massoudi, assigned to the assignee of the present application, which is incorporated herein by reference.

BACKGROUND OF THE INVENTION

1. Field of the Invention

This invention relates generally to error correction devices, and more particularly to error correction devices used in correcting data read from DVD media.

2. Description of the Related Art

In recent years, optical disc technology has gained popularity in computer and entertainment industries. For example, by providing superior digital sound quality, CD players and discs have effectively displaced phonographs in the music industry. In addition, CD-ROM technology has also become popular in the computer industry as well for recording and reading large amounts of information or data.

However, in response to an ever increasing demand for convenient storage devices with even greater storage capacity, a new optical media known as digital video disc or digital versatile disc (DVD) has emerged as a promising new technology. The DVD media technology provides many times the storage capacity of a conventional CD-ROM disc. For example, a DVD medium may store data, for example, between 4.7 Gigabytes up to 18 Gigabytes. In contrast, conventional CD-ROM discs are usually only capable of storing about 650 Megabytes of data. Of course, the capacity of a DVD medium may surpass 18 Gigabytes in the near future as technology improves.

Information in a DVD medium is stored in a similar manner as the traditional CD-ROM disc. Prior Art FIG. 1A illustrates a DVD medium 100 having a center hole 104. In the DVD medium 100, data is typically stored in units of sectors that are laid out in a continuous spiral 102 from the center hole 104 and extending through to the circumference of the DVD medium 100. Sectors are laid out along the spiraling track 102. For example, a portion 106 of the spiraling track 102 may include numerous sequential sectors.

Prior art FIG. 1B illustrates a more detailed layout of the portion 106 of the spiraling track 102 in the DVD medium 100. The portion 106 includes five sequential sectors 110, 111, 112, 113, and 114 (i.e., 110 through 114). Each of the sectors 110 through 114 stores user data of 2064 bytes.

Each of the sectors 110 through 118 contains a header field 120 and a data field 122. The header field 120 is typically assigned sixteen bytes. Of these sixteen bytes, the first four bytes store the sector number for identifying the sector, and the remaining bytes are used to store information related to error detection, copy protection, and payload error detection.

Often however, user data stored in or read from a DVD medium may become corrupted or contaminated. For example, contamination or corruption can occur for reasons such as scratches, dust, noise, and other imperfections. The contamination or corruption typically causes two types of errors: a random error and a burst error. The random error refers to a single bit of error. On the other hand, the burst error refers to an error involving a set of contiguous bits.

To protect against such random and burst errors, DVD technology typically implements an error correction code (ECC) block coding scheme. In the ECC block coding scheme, user data is organized and encoded in data sectors. A data sector contains 12 bytes of header, 2048 bytes of user data, and 4 bytes of EDC. The data sector is split into 12 rows of 172 bytes each. Each data sector is converted to a recording sector by adding 10 bytes of row check bytes (i.e., inner parity bytes) to each row and also adding 16 rows of column check bytes (i.e., outer parity bytes). The column check bytes are interleaved between 16 sectors of user data such that each sector is followed by a row of column check byte. Accordingly, each recording sector consists of 13 rows of 182 bytes each.

The recording sectors are converted to physical sectors by splitting each row of the recording sectors down the middle and adding a 1-byte sync code in front of each half-row. In addition, the data is processed with an 8-to-16 modulation (EFM plus), which replaces each byte with a 16-bit code. This conversion process results in the creation of 16 blocks of physical sectors within an ECC block. Each of the physical sectors consists of 4836 bytes. The physical sector data are then sequentially written out row by row to a DVD medium as channel data starting with the first sector in the ECC block. The first sector of the next ECC block immediately follows the last sector of the current ECC block.

Prior Art FIG. 1C illustrates a block diagram of a DVD data correction system 150 for correcting random and burst mode errors. In this system 150, an EFMPlus decoder 132 receives a stream of physical sector data from a DVD disc 130 and decodes the data from a 16- to 8-byte format. A disc manager controller 134 receives the decoded stream of data from the EFMPlus decoder 132 and identifies sync bytes to convert the physical sectors back to recording sectors. The disc manager 134 then transmits the recording sector data to a buffer 136. An error correction circuitry 138 reads the data in the buffer 136 and performs error correction on the sector data held in the buffer 136. Using the data contained in the buffer 136, the error correction circuitry 138 performs both row and column error corrections at this stage. In this process, the error correction circuitry 138 converts the recording sector data into the original user data for transmission to a host 140.

In the prior art DVD data correction system 150, the error correction circuitry 138 performs both row and column error corrections at the same stage of the data pipeline. Unfortunately, performing row and column error corrections at the same error correction stage can lead to a performance degradation. For example, when the header 120 in a desired sector 112 contains an uncorrectable error, sector 112 may never be identified during a search.

In order to address such a situation, conventional techniques typically read several sectors (e.g., 5 to 6 sectors) ahead of time. Then, if the sector 112 cannot be identified in the sequence of sectors, a pause in processing is required to enable one more revolution of the DVD media. This revolution of the DVD media will enable the same sectors to be re-read, including the sectors located around the un-identifiable header of sector 112. For instance, a DVD drive may determine that it has missed the desired sector when it is only able to read a header associated with the next sector. At this point, the DVD drive will determine that it has failed to detect the desired sector. In order to read the undetected header, the DVD drive must make another revolution of the DVD media to re-read the group of sectors. This time the DVD drive reads the unidentified sector by assuming that sector 112 is located between the identifiable sectors directly before and after the undetected sector (i.e., sectors 111 and 113, respectively).

By thus making another revolution around the DVD medium to re-read the undetected sector, the conventional system 150 results in significant performance and time penalties. Furthermore, since the conventional system 150 typically reads several sectors ahead of time, real time error detection and correction is not possible.

In addition, the conventional system 150, which performs the row and column error corrections at the same stage, also delays the identification of a desired sector. This is because the header typically is not processed until both the row and column data have been transferred to the buffer 136. In the conventional system 150, once a block of data has been transferred to the buffer 136, the row correction reads the entire data stored in the buffer 136 to perform the row corrections. Accordingly, the above described conventional techniques also tend to introduce delays associated with accessing and correcting the data in the buffer 136.

In view of the foregoing, what is needed is a device and method that can reliably correct the row data including the header in a DVD data sector without reading back the entire data in a buffer. What is further needed is a device and method that can provide the corrected row data including the header in real time to a DVD decoder for processing without introducing delays associated with loading and correcting the column data.

SUMMARY OF THE INVENTION

Broadly speaking, the present invention fills these needs by providing a device, method, and system for reliably detecting and correcting headers and rows of sector data that are read sequentially from a DVD medium in real time. It should be appreciated that the present invention can be implemented in numerous ways, including as a process, an apparatus, a system, a device, a method, or a computer readable medium. Several inventive embodiments of the present invention are described below.

In one embodiment, a device for performing a header and row correction on rows of sector data that are read sequentially from a DVD medium is disclosed. The device comprises a pair of row buffers, a syndrome generator, and an error correction circuitry. The pair of row buffers sequentially receives and stores a current row of the sector data. When one buffer is receiving a next row of the sector data and is functioning as a receive buffer, the other buffer stores the current row of the sector data and functions as a correction buffer to be used in error correction. The syndrome generator receives the current row of the sector data and is configured to sequentially generate a row syndrome for the current row. The row syndrome is configured to indicates whether an error is present in the current row that is stored in the correction buffer. The error correction circuitry is coupled to the syndrome generator and is configured to receive the row syndrome associated with the current row that is stored in the correction buffer. The error correction circuitry is configured to correct the error that is present in the current row that is contained in the correction buffer.

In another embodiment, the present invention provides a method for performing header and row correction on rows of sector data that are read sequentially from a DVD medium. The method comprises: a) sequentially receiving the rows of sector data that are being read from the DVD medium with each row including a plurality of check bytes for generating a syndrome; b) storing a current row of the sector data; c) receiving a next row of the sector data; d) detecting an error in the stored row of the data while the next row of the data is being received; and e) correcting the error in the stored current row of the sector data if the generated syndrome indicates the presence of the error while the next row of the sector data is being received.

In yet another embodiment, a system includes a means for performing header and row correction on rows of sector data that are read sequentially from an optical medium. The system includes a correcting buffer means, a receiving buffer means, a syndrome generating means, and a row correcting means. The correcting buffer means stores a current row of the sector data. The receiving buffer means sequentially receives a next row of the sector data. The syndrome generating means receives the current row of the sector data for generating a row syndrome for the current row that is stored in the correcting buffer means. The row syndrome indicates whether an error is present in the current row stored in the correcting buffer means. The row correcting means receives the row syndrome associated with the current row that is stored in the buffer means and is configured to access the current row that is stored in the correcting buffer means to perform a correction when the error is present in the current row.

Advantageously, the present invention provides a device, method, and system that can reliably correct the row data including the header in a DVD data sector without reading back an entire data block (e.g., sector) from a buffer to perform row error correction. Furthermore, the device and method of the present invention can provide the corrected row and header data in real time without introducing delays associated with loading and correcting the column data.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior art

Prior Art

DETAILED DESCRIPTION OF THE PREFERRED EMBODIMENTS

An invention is described for a device, method, and system for reliably detecting and correcting headers and rows of sector data that are read sequentially from a DVD medium in real time. It will be obvious, however, to one skilled in the art, that the present invention may be practiced without some or all of these specific details. In other instances, well known process operations have not been described in detail in order not to unnecessarily obscure the present invention.

Figure 1A:
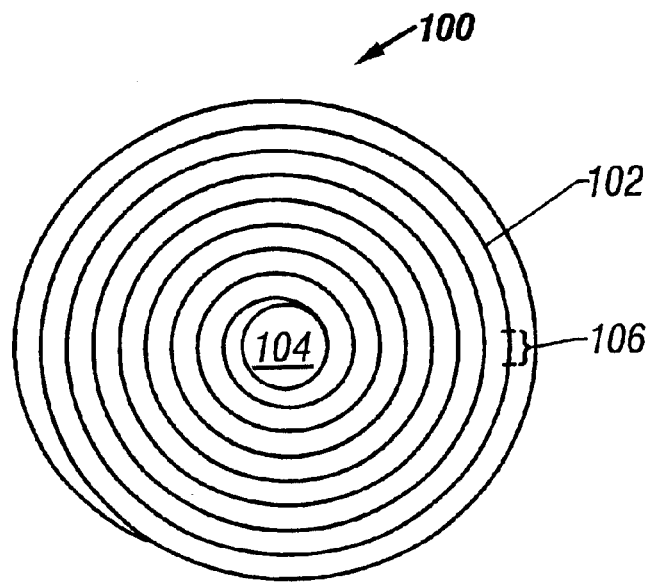
FIG. 1A illustrates a DVD medium depicting spiraling track from a center hole to the outer circumference.
Figure 1B:
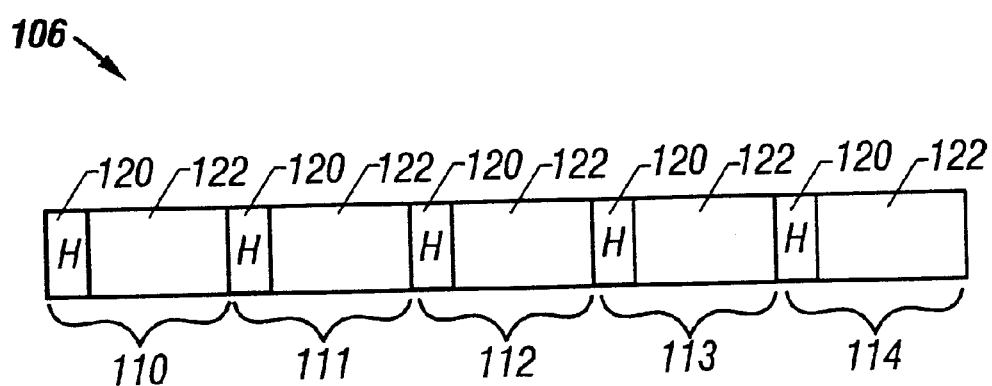
FIG. 1B illustrates a more detailed layout of a portion of the spiraling track in the DVD medium.
Figure 1C:
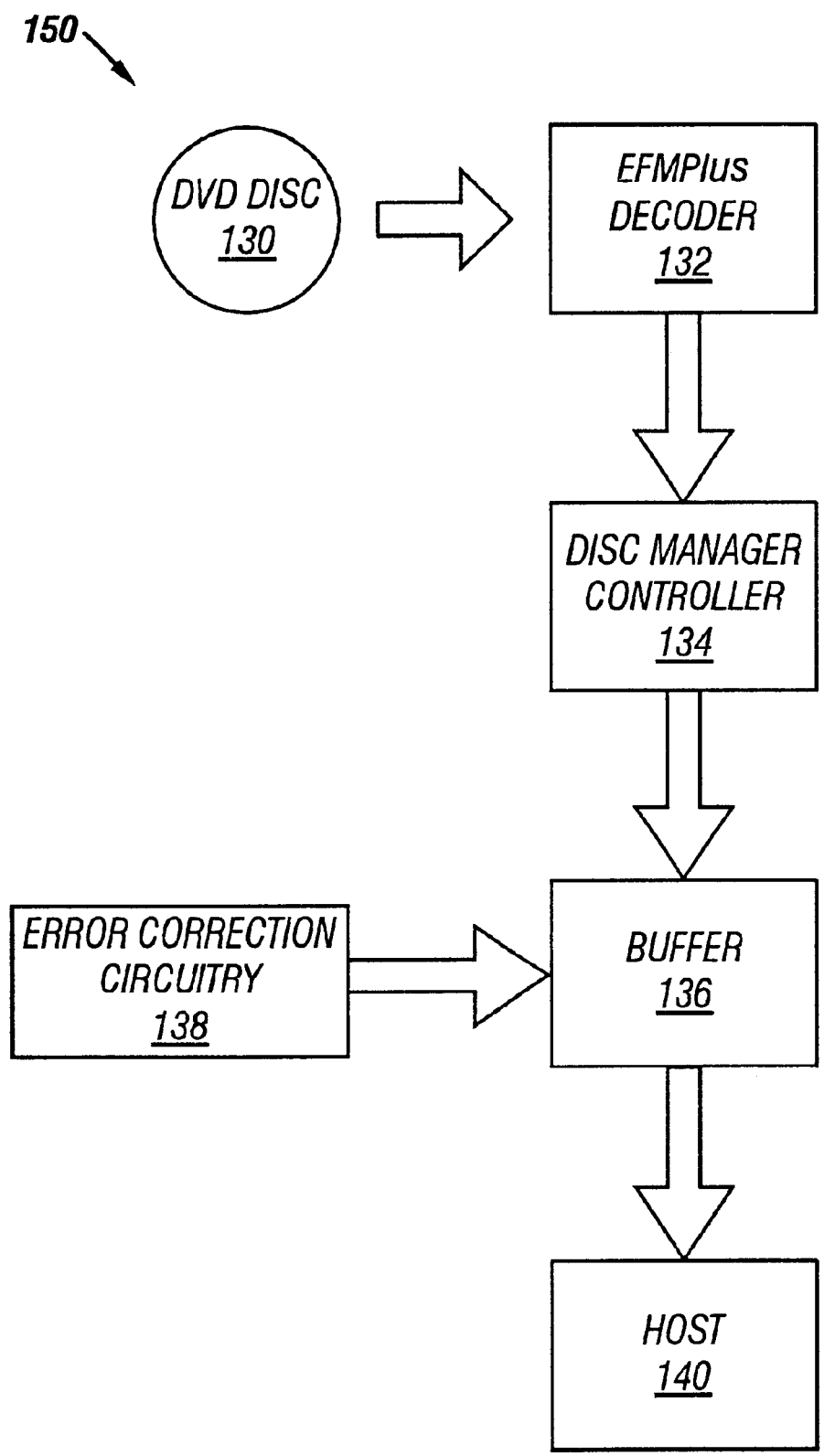
FIG. 1C illustrates a block diagram of a conventional DVD data correction system for correcting random and burst mode errors.
Figure 2:
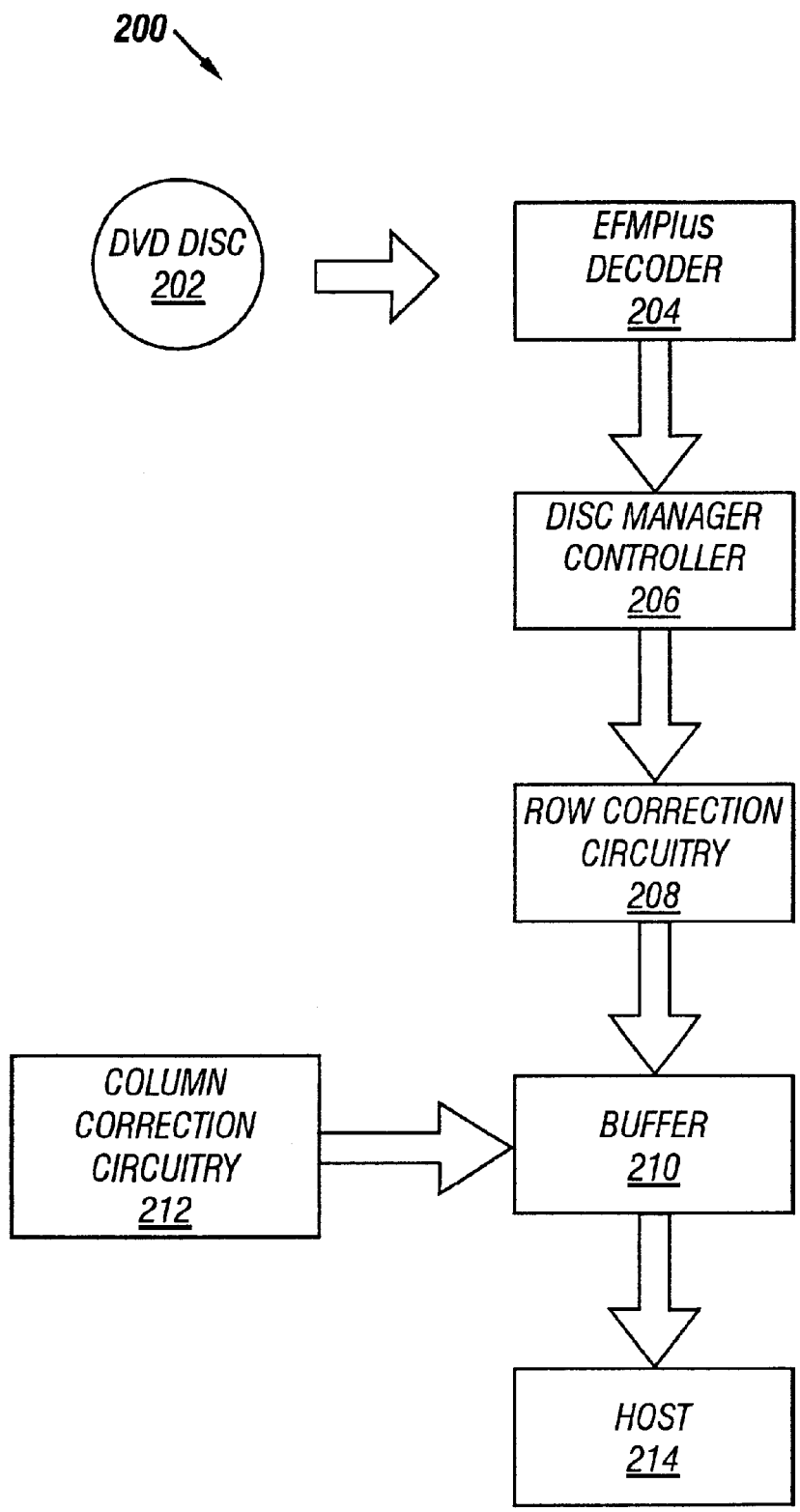
FIG. 2 illustrates a block diagram of a DVD error correction system for correcting random and burst mode errors in sequential rows of sector data in accordance with one embodiment of the present invention.

FIG. 2 illustrates a block diagram of a DVD error correction system 200 for correcting random and burst mode errors in accordance with one embodiment of the present invention. In the error correction system 200, an EFMPlus decoder 204 receives a stream of physical sector data from a DVD medium 202 and decodes the received data from a 16- to 8-byte format. A disc manager controller 206 is coupled to the EFMPlus decoder 204 and is configured to receive the decoded stream of data from the EFMPlus decoder 204. In an alternative embodiment of the present invention, the EFMPlus decoder 204 may be integrated within the disc manager controller 206 as a sub-unit. The DVD medium 202 may include both DVD disc and DVD-ROM disc. A DVD disc is typically played back by a DVD player for playing the DVD disc such as audio DVD disc, video DVD disc, karaoke DVD disc, etc. On the other hand, DVD-ROM disc is read by a DVD-ROM drive for use in conjunction with a computer system. As used herein, the term DVD medium refers to both DVD-RAM disc and DVD-ROM disc.

With reference still to FIG. 2, the disc manager controller 206 detects sync bytes and converts the physical sectors back into recording sectors. The disc manager controller 206 transmits the converted recording sectors to a row correction circuitry 208. In addition, the disc manager controller 206 controls the flow of data in the DVD error correction system 200.

As mentioned above, the row correction circuitry 208 is coupled to the disc manager controller 206 and receives the recording sectors. The row correction circuitry 208 performs row error detection and correction on a row-by-row basis in real time. As a part of its row error detection and correction task, the row correction circuitry 208 performs header corrections and communicates corrected header information back to the disc manager controller 206. As will be discussed below, the row correction circuitry 208 includes a pair of row buffers for temporarily receiving and storing the rows.

After performing row error detection and correction in real time, the row correction circuitry 208 sequentially transmits or outputs the rows, one row at a time, to a buffer 210 that is configured to receive the data. A column correction circuitry 212 is coupled to and communicates with the buffer 210 for performing column error detection and correction. After the column error detection and correction stage, the recording sector data is converted into the original user data format for transmission to a host 162.

Figure 3:
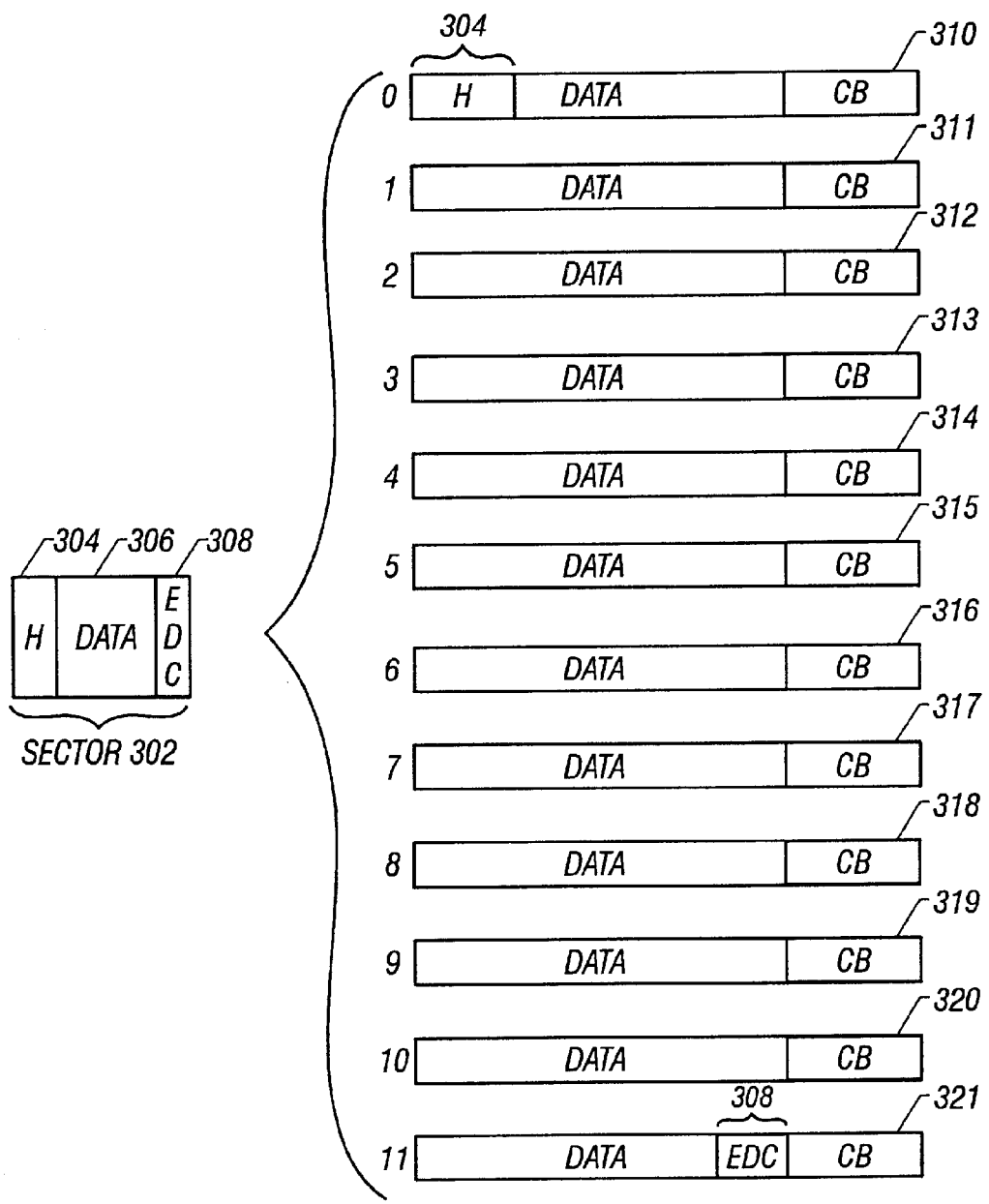
FIG. 3 illustrates a diagram of an exemplary DVD sector including 12 rows.

FIG. 3 illustrates a diagram of an exemplary DVD sector 302 including 12 rows, 0 through 11. On a macroscopic level, the sector 302 includes a header 304, data 306, and an error-detection code (EDC) 308. The EDC 308 consists of four bytes and is an error-detection code that is typically applied at the end of a DVD sector for an added layer of error detection.

On a microscopic level, the sector 302 is divided into 12 rows, 0 through 11. The rows 0 through 11 are organized sequentially in a DVD medium so that the row 0 includes the header 304, data immediately following the header, and a 10-byte inner parity (i.e., check byte "CB") 310 for the first row 0. The rows 1 through 10 contain sequential data in the sector 302 and 10-byte inner parities 311 through 321, respectively, for each individual rows for error detection and correction. The last row 11 contains the final portion of data of the sector 302, EDC 308, and a check byte for row 11. In these row configurations, each row can be checked for row errors by utilizing the associated inner parity (i.e., check byte) to determine the error value and error location.

Figure 4A:
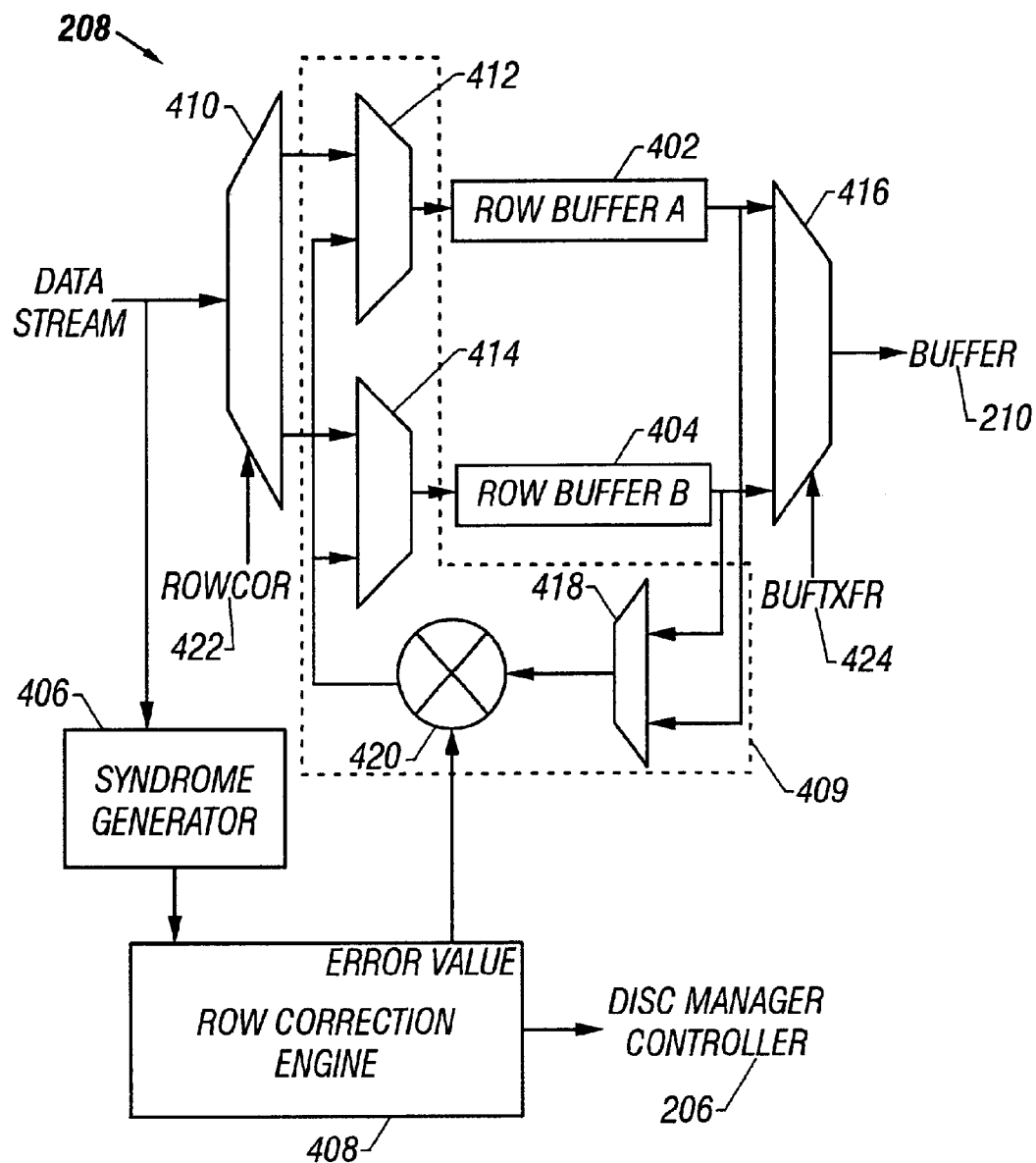
FIG. 4A illustrates a block diagram of a row correction engine in accordance with one embodiment of the present invention.

FIG. 4A illustrates a block diagram of the row correction circuitry 208 in accordance with one embodiment of the present invention. The row correction circuitry 208 includes an input demultiplexer 410, a row buffer A 402, a row buffer B 404, a syndrome generator 406, a row correction engine 408, an output multiplexer 416, and an error correction feedback circuitry 409. The error correction feedback circuitry 409 includes a pair of multiplexers 412 and 414, an XOR gate 420, and a multiplexer 418.

In this configuration, the row correction circuitry 208 receives a data stream from the disc manager controller 206 for detecting and correcting row errors on a row-by-row basis. The row correction circuitry 208 uses the buffers A 402 and B 404 to buffer the data received from the disc manager controller 206. The buffers A 402 and B 404 are temporary storage devices for receiving and holding row data for correction. Except when the first row is received, the buffers A 402 and B 404 alternate as a receiving buffer for receiving the row data and as a correction buffer for storing the received row data for error correction.

In this dual buffer configuration, the data stream is routed to the row buffer A 402 or the row buffer B 404 in an alternating fashion through the input demultiplexer 410 so that one buffer can receive a row of data as a receive buffer while the other buffer is used for correcting a row error in real time as a correction buffer. In particular, the buffers A 402 and B 404 form a Ping-Pong structure that switch functionality between a correction buffer and a receive buffer. That is, when one buffer is used in row correction as a correction buffer, the other buffer is used to receive a row of data as a receive buffer. The received data originating from a DVD medium is stored in one of the buffers A 402 and B 404 in an alternating fashion. In this manner, when one row has been received in a receive buffer, the receive buffer then becomes the correction buffer and is used for correcting the row data stored in the correction buffer. In the meantime, the next row is received and stored in the other buffer, which now acts as the receive buffer.

In one embodiment of the present invention, the row buffer A 402 is initially selected to receive the first row of a sector. When the row buffer A 402 captures the first full row, the control signal ROWCOR switches the buffer by routing the next (i.e., second) row into the row buffer B 404. While the row buffer B 404 is capturing the second row, the row correction circuitry 208 detects errors, if any, in the previously received row and corrects the errors, if determined to be correctable. Alternatively, the row buffer B 402 can be selected to receive the first row of data initially.

In a particular embodiment of the present invention, the demultiplexer 410 routes the data stream to either one of the row buffers A 402 and B 404 through a pair of multiplexers

412 and 414. The multiplexer 412 is coupled between the demultiplexer 410 and the row buffer A 402 to enable selective transfer of data to the row buffer A 402. Likewise, the multiplexer 414 is coupled between the demultiplexer 410 and the row buffer B 404 to enable selective transfer of data to the row buffer B 404. In this configuration, the demultiplexer 410 routes the data stream into either one of the row buffers A 402 and B 404, which at that time will be operating as a receive buffer. The multiplexers 412 and 414, on the other hand, route corrected row data into either one of the row buffers A 402 and B 404, which is operating as a correction buffer.

To control the flow of data into the receive buffer (i.e., either of the row buffers A 402 and B 404), a control signal ROWCOR 422 can be used control the demultiplexer 410 to select either one of the buffers to transfer the incoming data stream. The control signal ROWCOR 422 is asserted at row boundaries where row correction is required to check for sector number information. The control signal ROWCOR 422 is preferably generated by the disc manager controller 206, which controls the data flow. In the alternative, the control signal ROWCOR 422 may be generated internally in the row correction circuitry 208.

Similarly, in order to control the flow of data into the correction buffer, a feedback control signal can be used to select the correction buffer to transfer the row data to and from the correction buffer through the multiplexers 418, 414, and 412. Like the control signal ROWCOR 422, the feedback control signal is asserted at row boundaries. Because when one row buffer is acting as a correction buffer, the other will be acting as a receive buffer, the feedback control signal can easily be generated and synchronized to the control signal ROWCOR 422. For example, the feedback control signal for controlling the data flow to and from the correction buffer can be generated by inverting the ROWCOR signal. The feedback control signal is also preferably generated by the disc manager controller 206, which controls the data flow. In the alternative, the control signal ROWCOR 422 may be generated internally in the row correction circuitry 208.

While the demultiplexer 410 receives the data stream, the Syndrome generator 406 also receives the row data including the check bytes to generate syndromes, which can be used to determine error values and error locations. More specifically, the syndrome generator 406 generates syndromes for the row that is being received in either of the buffers A 402 and B 404 so that error correction can proceed on-the-fly when the buffer becomes the correction buffer. The syndrome generator 406 generates two types of syndromes: a zero syndrome and a non-zero syndrome. The zero syndrome indicates that no error has been detected in the row. On the other hand, a non-zero syndrome indicates that an error has been detected in the row and that ECC may need to be performed. Depending on the magnitude of the error, the error may or may not be correctable. The syndrome generator 406 implements well known syndrome generation algorithms to generate the row syndromes.

The syndrome generator 406 generates the row syndromes on-the-fly as data is transferred to either one of the row buffers A 402 and B 404 that are operating as a receive buffer. The generated row syndromes are transferred to the row correction engine 408 when the receive buffer becomes a correction buffer at the end of each row. The syndrome generator 406 generates 10 bytes of syndromes in internal syndrome registers for each 182 bytes of user data, which is equivalent to a row in an ECC block. At the end of the last byte of a row being received, a syndrome ready signal can be generated and transmitted to the row correction engine 408 to indicate that the syndromes are ready to be transferred.

The row correction engine 408 is coupled to the syndrome generator 406 to receive the generated syndrome for the row. In response to the syndrome ready signal, the row correction engine 408 receives the syndrome bytes before the next user data byte arrives. After the transfer, the syndrome register can be rest to zero.

The row correction engine 408 then performs error detection and correction computations. For example, the row correction engine 408 uses the received syndromes to generate an "error value" and "error location" for the row associated with the syndrome. The error value is then output to the XOR gate 420 for correcting the errors of the received row in either buffers A 402 or B 404. The row correction engine 408 implements well known algorithms for performing row error correction computations. Exemplary algorithms for performing syndrome generation and error corrections are described, for example, in a co-pending U.S. patent application having Ser. No. 08/933,568, and entitled "METHOD AND APPARATUS FOR PERFORMING ERROR CORRECTION CODE OPERATIONS", now U.S. Pat. No. 6,041,431. This application is incorporated by reference herein.

With reference to FIG. 4A, the error correction takes place through the error correction feedback circuitry. In the error correction feedback circuitry, the multiplexer 418 is coupled to the row buffers A 402 and B 404 to select and route the content of the error location in the correction buffer for error correction. The multiplexer 418 transmits the content of the error location in the correction buffer to the XOR gate 420, which is coupled to the row correction circuitry 208. In this manner, the error value associated with the error location of the row in the correction buffer is transferred to the XOR gate 420. The XOR gate 420 performs an XOR operation on the input data from the correction buffer and the error value from the row correction engine 408, and then outputs corrected row data. The error corrected output data from the XOR gate is directed back to the correction buffer for storage through either one of the multiplexers 412 and 414.

When the error correction is complete or when no error correction is needed in the correction row, the content of the correction buffer is then written to the buffer 210 through the output multiplexer 416, which selects the correction buffer in response to a control signal BUFTXFR 424 that is transmitted from the disc manager controller 206. When the data in the correction buffer has been corrected, the control signal BUFTXFR 424 ensures that the data in the correction buffer is not transferred to buffer 210 until an ECC block boundary is reached that contains the sector number that the host 214 has requested.

When no error is detected, the row correction engine 408 transmits a signal to the disc manager controller 206 indicating that no error has been detected in the row. When a first row of a sector is being processed, the signal also indicates that the header does not contain an error so that the disc manager controller 206 may perform signal management tasks. On the other hand, if an error is detected, the row correction engine 408 transmits a signal to the disc manager controller 206 indicating that the row contains an error. If the row also contains a header, as is the case of a first row of a sector, the signal also indicates that the header contains an error. The signal enables the disc manager controller 206 to synchronize control and dataflow signals. When an error is detected in a header or row, the disc manager controller 206 can also determine a correct value of the header or row for controlling and synchronizing signals.

Figure 4B:
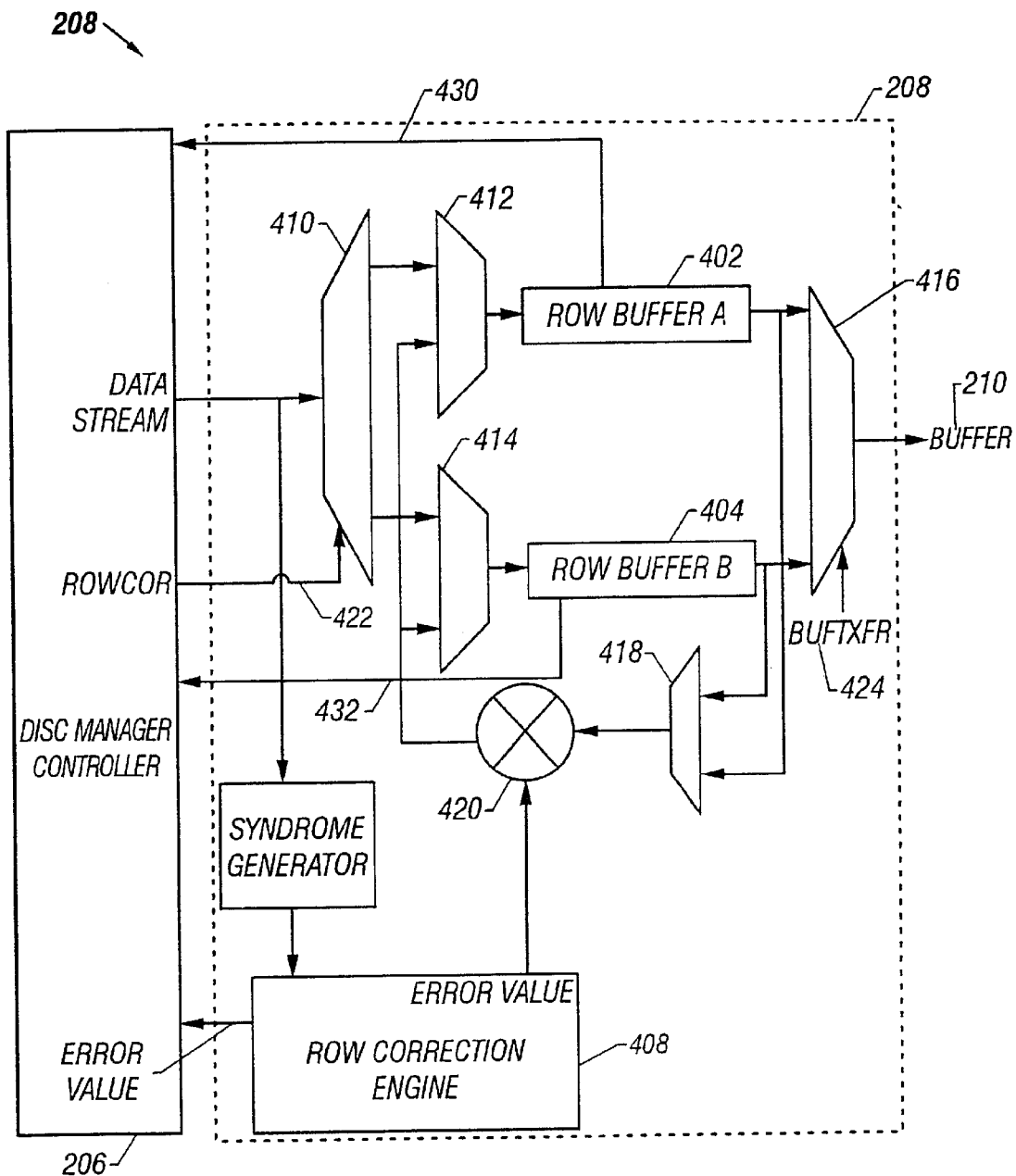
FIG. 4B illustrates the row correction engine communicating with a disc manager controller in accordance with another embodiment of the present invention.

FIG. 4B illustrates the row correction circuitry 208 in accordance with another embodiment of the present invention. In this embodiment, the disc manager controller 206 is coupled to the row correction engine 408 to enable it to receive an error value generated by the row correction engine 408. The disc manager controller 206 includes an XOR gate (not shown) and performs XOR operations on the received error value complete the correction of data. Alternatively, the disc manager controller 206 can be coupled to the row buffers A 402 and B 404 via lines 430 and 432, respectively, to receive the corrected row values.

When the disc manager controller 206 has established sector sync and intends to read header information or transfer data to the row buffers A 402 and B 404, data is transferred to the row correction engine 408 from the disc manager controller 206. During a header read stage, the disc manager controller 206 transfers data to the row correction circuitry 208 for performing header ECC check in the first row of a sector.

After the correction process, the physical sector number in the header is used by the disc manager controller 206 to confirm that the sector number is correct. When a row in a sector is uncorrectable a flag is set. In this case, the disc manager controller 206 relies on its EDC check bytes to determine if the sector number is reliable. The disc manager controller 206 latches the header information when the first row in a sector is detected or corrected. In the foregoing manner, the present invention thus allows reliable correction of the row data, including the header in a DVD data sector. Furthermore, the present invention generates the corrected row and header data in real time without introducing delays associated with loading and correcting the column data.

Figure 5:
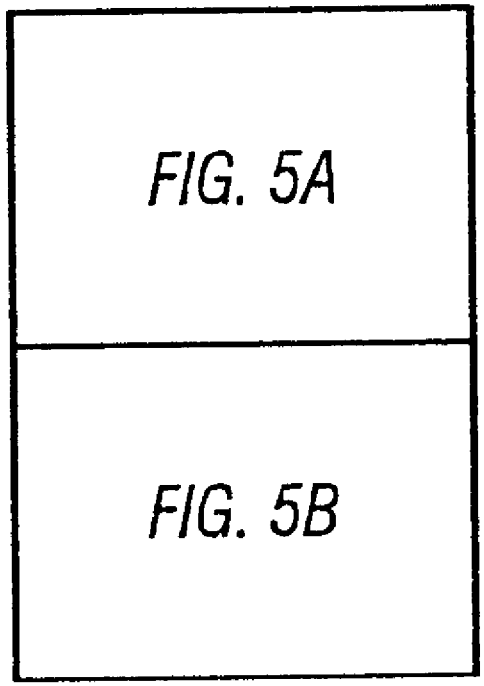
FIG. 5 illustrates a flow diagram of the method operations involved in detecting and correcting rows of a data sector in accordance with one embodiment of the present invention.
Figure 5A:
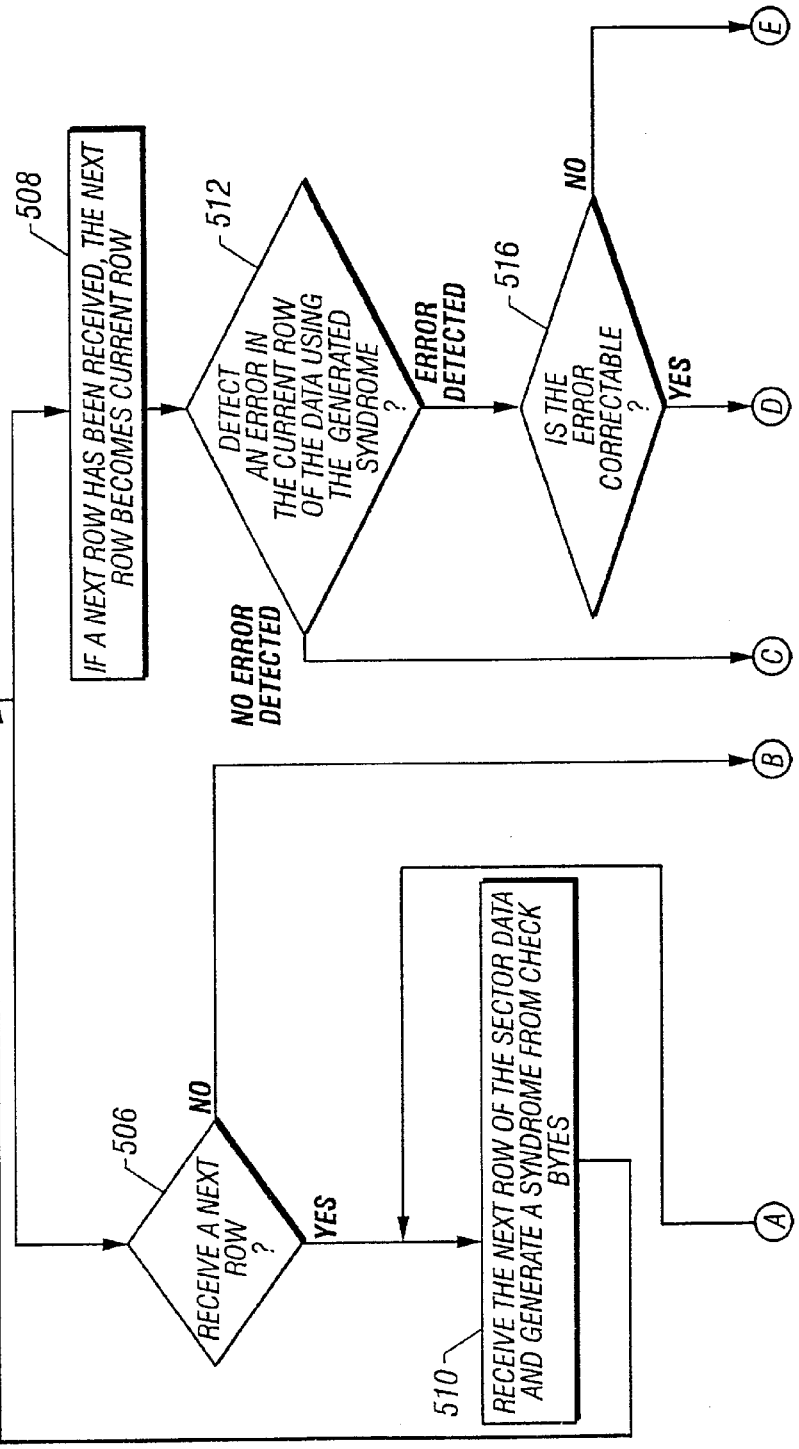
Figure 5B:
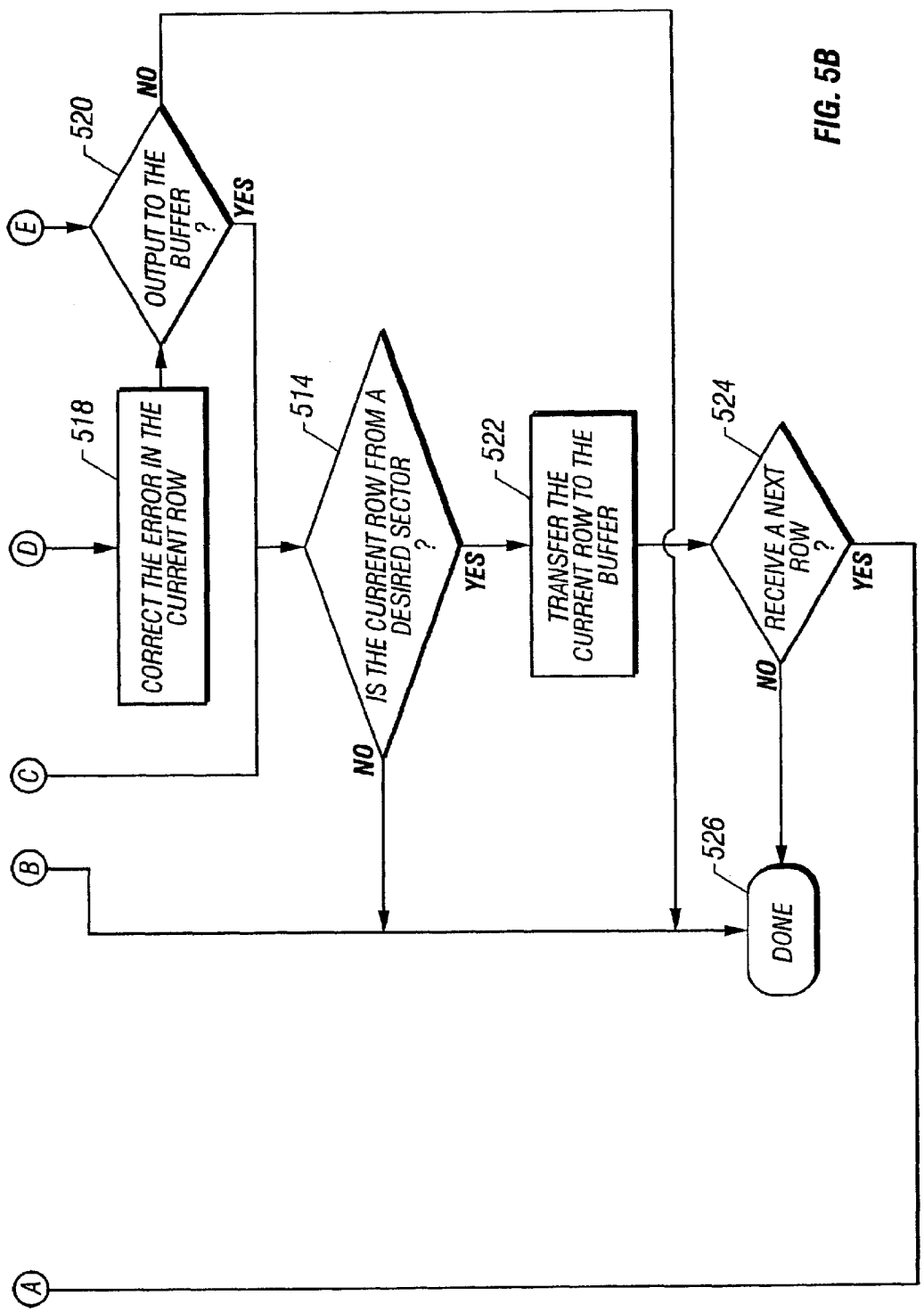

FIG. 5 illustrates a flow diagram of the method operations involved in detecting and correcting rows of a data sector in accordance with one embodiment of the present invention. In operation 502, the method sequentially receives the rows of sector data that are being read from a DVD medium. The rows are received sequentially, one row at a time. Each row has check bytes for row error detection and correction. In operation 504, a row of the sector data is received as a current row and generates syndromes for the current row from the check bytes of the current row.

When all the data in the current row has been received, the method proceeds in two parallel branches of operations: operations 506 and 510 forming a first branch, and operations 508, 512, 514, 516, 518, 520, 522, and 524 forming a second branch. These two branches of operations are performed concurrently and in parallel. The first branch of operations begins in operation 506, where the method of the present embodiment determines whether to receive a next row. A next row need not be received or stored if, for example, the header indicates that the sector is not a desired or target sector. If the next row needs to be received, the next row of the sector data is received and a syndrome for the next row is generated from the associated check bytes in operation 510. In operation 506, if a next row need not be received or does not exist, the method proceeds to operation 526, where the first branch operation terminates.

In operation 508 of the second branch, the method of the present embodiment determines if a next row has been received and if it has been received, the next row becomes the current row. Otherwise, the previous current row remains as the current row. For example, when a first row of a sector has been received, the first row is the current row. When the second row has been received in operation 510 as the next row, the second row subsequently becomes the current row for error detection and correction.

Continuing in the second branch, the method in operation 512 detects whether an error is present in the current row using the generated syndrome for the row. If no error is detected, the method proceeds to operation 514 and determines whether the current row is from a desired or target sector. If the current row is not from a desired or target sector, the method terminates in operation 526. On the other hand, if the current row is from a desired or target sector (i.e., contains desired data), the method proceeds to operation 522 where the data in the current row is transferred to an output buffer.

If on the other hand, in operation 512, an error is detected in the current row, the method proceeds to operation 516 and determines whether the error is a correctable error. If the error is not correctable, the operation proceeds to operation 520 for determining whether the row should be output to an output buffer. Otherwise, if operation 516 determines that the error in the current row is correctable, the error is corrected in operation 518. Then the method proceeds to operation 520 and determines whether the row needs to be output to an output buffer. If the current row does not need to be output to the output buffer, the method terminates in operation 526.

On the other hand, if the current row needs to be output to the output buffer, the method proceeds to operation 514 where it is determined whether the current row is from a desired sector. If not, the method terminates in operation 526. If yes, the current row is transferred to the buffer in operation 522. Then, the method in operation 524 determines whether to receive a next row. If no more rows need to be received, the method terminates in operation 526. Otherwise, the method proceeds back to operation 510 where the next row of the sector data is received and syndromes are generated for the received row. The method will therefore continue until no more rows are being received.

Advantageously, the present invention provides a device, method, and system that can correct the row data including the header in a DVD data sector on-the-fly. Accordingly, the present invention eliminates the need to read back an entire data block (e.g., sector) from a buffer to perform a row error correction. Furthermore, the device and method of the present invention can provide the corrected row and header data in real time without introducing delays associated with loading and correcting the column data.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, New York may be used to design an appropriate silicon-level layout. Although any suitable design tool may be used, another layout tool may include a hardware description language "Verilog®" tool available from Cadence Design Systems, Inc. of Santa Clara, Calif.

The invention may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A device for performing header and row correction on rows of sector data that are read sequentially from a DVD medium, said device comprising:

a pair of row buffers for sequentially receiving and storing a current row of said sector data, wherein when one of the pair of row buffers is receiving a next row of said sector data and is functioning as a receive buffer, and another one of the pair of row buffers stores the current row of said sector data and is functioning as a correction buffer;

a syndrome generator receiving said current row of said sector data and being configured to sequentially generate a row syndrome for said current row as said next row is being received by said receive buffer, said row syndrome configured to indicate whether an error is present in said current row that is stored in said correction buffer; and error correction circuitry coupled to said syndrome generator and being configured to receive said row syndrome associated with the current row that is stored in said correction buffer, and wherein said error correction circuitry is configured to correct said error that is present in said current row that is contained in the correction buffer while the next row is being received in the receive buffer.

2. The device as recited in claim 1, wherein said pair of row buffers alternates as the receive buffer and as the correction buffer.

3. The device as recited in claim 1, wherein each of said pair of row buffers sequentially receives alternating rows of said sector data.

4. The device as recited in claim 1, wherein said error correction circuitry further comprises:

row correction circuitry configured to receive said row syndrome for generating an error value and an error location in said current row that is in said correction buffer when said syndrome indicates that the error is present in said current row; and error correction feedback circuitry coupled to said correction buffer and to said row correction circuitry for correcting the error in said error location of said current row, wherein the error correction feedback circuitry corrects the error in the current row using said error value to generate a corrected row and stores the corrected row into said correction buffer.

5. The device as recited in claim 4, wherein said error correction feedback circuitry comprises an XOR gate that receives as inputs the error values and said current row stored in said correction buffer corresponding to said error location, wherein said XOR gate corrects the error in said current row to generate the corrected row for storage back into said correction buffer.

6. The device as recited in claim 4, further comprising:

a demultiplexer coupled to said receive buffer for sequentially routing said rows of said sector data to said receive buffer.

7. The device as recited in claim 4, further comprising:

a demultiplexer coupled to said pair of buffers for sequentially routing said rows of said sector data to said pair of buffers.

8. The device as recited in claim 4, further comprising:

an output multiplexer coupled to said pair of row buffers for outputting the row in said correction buffer.

9. The device as recited in claim 5, wherein said error correction feedback circuitry further comprises:

a feedback multiplexer coupled to said correction buffer and said receive buffer for routing said current row in said correction buffer to said XOR gate; and a first multiplexer coupled between said XOR gate and said pair of row buffers for routing said corrected row into said correction buffer.

10. The device as recited in claim 8, further comprising:

a second multiplexer coupled between said XOR gate and said pair of row buffers for routing said corrected row into said correction buffer, wherein said first multiplexer and said second multiplexer are coupled between a demultiplexer and said pair of row buffers to route said rows of sector data sequentially into the receive buffer and route said corrected row into said correction buffer in parallel.

11. A method for performing header and row correction on rows of sector data that are read sequentially from a DVD medium, said method comprising:

sequentially receiving the rows of sector data that are being read from the DVD medium, each row including a plurality of check bytes for generating a syndrome;

storing a current row of the sector data;

receiving a next row of the sector data;

detecting an error in the stored current row of the sector data while the next row of the data is being received; and correcting the error in the stored current row of the sector data if the generated syndrome indicates the presence of the error while the next row of the sector data is being received.

12. The method as recited in claim 11, wherein said error detecting operation generates a syndrome for the stored current row of the sector data, said syndrome indicating whether the stored current row of data contains an error.

13. The method as recited in claim 12, wherein said error correcting operation determines an error value and an error location for the error detected in the stored current row of the sector data from said syndrome.

14. The method as recited in claim 13, wherein said error correcting operation corrects the error in the stored current row of the sector data using the error value and the error location generated from said syndrome.

15. The method as recited in claim 14, wherein said error correcting operation corrects the error in the stored current row of the sector data to generate a corrected row the sector data by XOR-ing the error value with the sector data in said stored current row corresponding to the error location.

16. The method as recited in claim 15, further comprising outputting the corrected row of the sector data.

17. The method as recited in claim 11, further comprising:
   receiving a new next row of the sector data;
   detecting an error in the stored next row of the sector data while the new next row of the sector data is being received; and
   correcting the error in the stored next row of the sector data while the new next row of the sector data is being received.

18. A system for performing header and row correction on rows of sector data that are read sequentially from an optical medium, said system comprising:
   a correcting buffer for storing a current row of said sector data;
   a receiving buffer means for sequentially receiving a next row of said sector data;
   a syndrome generating means receiving said current row of said sector data for generating a row syndrome for said current row that is stored in said correcting buffer means while said next row is being received by said receiving buffer, said row syndrome indicating whether an error is present in said current row that is stored in said correcting buffer means; and
   a row correcting means receiving said row syndrome associated with the current row that is stored in said correcting buffer means, and configured to access the current row that is stored in the correcting buffer means to perform a correction when the error is present in the current row while said next row is being received in said receiving buffer.

19. The system as recited in claim 18, wherein said receiving buffer means and said correcting buffer means alternate so as to receive alternating rows of said sector data.

20. The system as recited in claim 18, wherein said row correcting means further comprises:
   a correction means configured to receive said row syndrome for generating an error value and an error location in said current row in said correcting buffer means when said syndrome indicates that the error is present in said current row that is stored in said correcting buffer means; and
   an error correction feedback means coupled to said correcting buffer means and to said correction means for correcting the error in said error location of said current row that is stored in said correction buffer means, wherein the error correction feedback means corrects the error in the current row corresponding to the error location by using said error value to generate a corrected current row.

21. The system as recited in claim 20, wherein said error correction feedback means comprises an XOR gate means receiving as inputs the error values and said current row that is stored in said correcting buffer means corresponding to said error location, wherein said XOR gate means corrects the error in said current row that is stored in said correcting buffer means to generate the corrected row for storage back into said correcting buffer means.

22. The system as recited in claim 20, further comprising:
   a routing means for sequentially routing said rows of said sector data to said receiving buffer means.

23. The system as recited in claim 20, wherein said routing means sequentially routes said rows of said sector data to said receiving buffer means and said correcting buffer means.

24. The system as recited in claim 20, further comprising:
   an output routing means for outputting the corrected row that is stored in said correcting buffer means.

25. The system as recited in claim 21, wherein said error correction feedback means further comprises:
   a feedback means coupled to said correcting buffer means and said receiving buffer means for routing said current row in said correcting buffer means to said XOR gate means; and
   a first routing means for routing said corrected row into said correcting buffer means.

26. The system as recited in claim 25, further comprising:
   a second routing means for routing said corrected row into said correcting buffer means, wherein said first routing means and said second routing means route said rows of sector data sequentially into the receive buffer and route said corrected row into said correction buffer in parallel.

* * * * *